(12) United States Patent
Yu

(10) Patent No.: US 6,323,143 B1
(45) Date of Patent: Nov. 27, 2001

(54) METHOD FOR MAKING SILICON NITRIDE-OXIDE ULTRA-THIN GATE INSULATING LAYERS FOR SUBMICROMETER FIELD EFFECT TRANSISTORS

(75) Inventor: Mo-Chiun Yu, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/534,161

(22) Filed: Mar. 24, 2000

(51) Int. Cl.[7] .................................................. H01L 21/31
(52) U.S. Cl. .................... 438/791; 438/762; 438/763; 438/253; 438/296; 438/238; 257/133; 257/411
(58) Field of Search .................... 438/791, 253, 438/296, 238, 762, 763; 257/411, 133

(56) References Cited

U.S. PATENT DOCUMENTS

| | | | |
|---|---|---|---|
| 4,621,277 | * 11/1986 | Ito et al. | 257/133 |
| 4,623,912 | * 11/1986 | Chang et al. | 357/411 |
| 4,882,649 | * 11/1989 | Chen et al. | 361/313 |
| 5,250,456 | * 10/1993 | Bryant | 438/253 |
| 5,324,675 | 6/1994 | Hayabuchi | 437/42 |
| 5,650,344 | 7/1997 | Ito et al. | 437/40 |
| 5,663,087 | * 9/1997 | Yokozawa | 438/762 |
| 5,808,348 | 9/1998 | Ito et al. | 257/410 |
| 6,200,844 | * 3/2001 | Huang et al. | 438/238 |
| 6,207,586 | * 3/2001 | Ma et al. | 438/763 |
| 6,215,163 | * 4/2001 | Hori et al. | 257/411 |

OTHER PUBLICATIONS

S. Wolf, Silicon Processing for the VLSI Era 1990, Lattice Press, vol. 1, pp. 57–58.*
S. Wolf, Silicon Processing for the VLSI Era 1990, Lattice Press, vol. 3, pp. 648–660.*

* cited by examiner

Primary Examiner—Matthew Smith
Assistant Examiner—Belur V Keshavan
(74) Attorney, Agent, or Firm—George O. Saile; Stephen B. Ackerman

(57) ABSTRACT

A method for making an improved ultra-thin silicon nitride-oxide gate insulating layer for field effect transistors (FETs) is achieved. After forming a field oxide to electrically isolate device areas on a silicon substrate, an ultra-thin silicon nitride-oxide insulating layer is formed in two process steps. In the first process step a silicon nitride layer is formed on the device areas on the substrate using a low-pressure rapid thermal process (LP-RTP) and a reactant gas of ammonia ($NH_3$) while insuring that the RTP tool is free of oxygen. Then a second process step is carried out sequentially in the same LP-RTP at an elevated temperature and using an oxygen-rich ambient (dinitrogen oxide $N_2O$) as a reoxidation gas. The non-self-limiting characteristic of the ultra-thin-silicon nitride layer results in the controllable diffusion of the dissociated oxygen (O) and nitrous oxide (NO) through the silicon nitride layer to form a thin good quality silicon oxide layer on and in the substrate surface.

22 Claims, 3 Drawing Sheets

METHOD FOR MAKING SILICON NITRIDE-OXIDE ULTRA-THIN GATE INSULATING LAYERS FOR SUBMICROMETER FIELD EFFECT TRANSISTORS

BACKGROUND OF THE INVENTION (1) Field of the Invention

The present invention relates to the fabrication of integrated circuit devices on semiconductor substrates, and more particularly relates to a method for making an improved ultra-thin silicon nitride-oxide gate insulating layer for field effect transistors with deep submicrometer channel lengths.

(2) Description of the Prior Art

Advances in the semiconductor process technologies in the past few years have dramatically decreased the device feature sizes and increased circuit density on integrated circuit chips. The device used the most for these Ultra Large Scale Integration (ULSI) applications is the Field Effect Transistor (FET) which consists of a polysilicon or polycide gate electrode formed over a thin gate oxide with self-aligned source/drain contact areas. The popular choice of FETs is because of their very small size, high packing density, low power consumption, high yields, and low cost of manufacturing.

The conventional FETs are typically fabricated by patterning polysilicon gate electrodes over a thin gate oxide on a single-crystal semiconductor substrate. As the size of the polysilicon gate electrode structure is scaled down in the horizontal direction to provide submicrometer FET channel lengths to increase circuit density and speed, it is also necessary to scale back in the vertical dimensions. Therefore it is necessary to form more shallow source/drain junctions and it is also necessary to reduce the gate oxide thickness ($T_{ox}$) for reduced gate voltage ($V_g$).

However, as the FETs are down scaled to submicrometer channel length, the FET device experiences a number of undesirable electrical characteristics results. Besides the need to minimize the various short channel effects, it is also necessary to minimize the oxide leakage current through the FET ultra-thin gate oxide. As the gate oxide thickness is scaled down approaching thicknesses less than 16 Angstroms, direct electron tunneling through the gate oxide occurs. When this oxide leakage current becomes comparable to the FET off-current ($I_{off}$), the standby power for the FET becomes unacceptably high.

Numerous methods for making improved ultra-thin gate oxides have been reported in the literature. For example, in U.S. Pat. No. 5,324,675 to Hayabuchi, a method is described for making a MONOS (metal-oxide/nitride/oxide-silicon) gate insulating layer for non-volatile memory. The method grows a thin oxide and deposits a silicon nitride. The silicon nitride is then partially oxidized to form an oxide/nitride/oxide gate oxide for non-volatile memory. A polysilicon gate electrode and the thin silicon nitride layer adjacent to the gate electrode are oxidized to from a silicon oxide which can be removed without damaging the source/drain areas. The oxide/nitride/oxide gate insulating layer remains under the gate electrode to form a non-volatile memory cell. Another method of making thin gate oxides is described in U.S. Pat. No. 5,650,344 to Ito et al. and in U.S. Pat. No. 5,808,348 to Ito et al. Ito teaches a method for a non-uniform nitrided gate oxide structure in which the gate insulating layer remains essentially pure silicon oxide under the center of the gate electrode while the gate insulator is nitrogen-rich at the edge of the gate electrodes.

In recent years there has been an increasing interest in making ultra-thin gate oxides using a new low-pressure (reduced pressure) rapid thermal process (LP-RTP) technique, commonly referred to as in-situ steam generation (ISSG). In this method an in-situ steam is generated from ultra-pure hydrogen ($H_2$) and oxygen ($O_2$) at low pressures to controlably grow gate oxides that are less than 25 Angstroms thick.

However, there is still a strong need in the semiconductor industry to form ultra-thin gate oxides for FETs with improved low leakage currents and with increased processing latitude (windows) using LP-RTP while maintaining a cost-effective manufacturing process.

SUMMARY OF THE INVENTION

It is a principal object of this invention to provide a novel nitride-oxide ultra-thin gate insulating layer for field effect transistors with reduced leakage currents and is compatible with current dual-gate oxide processes.

It is another object of this invention to form this ultra-thin nitride-oxide gate insulating layer using a novel low-pressure rapid thermal process and an ultra-thin silicon nitride layer that also reduces or prevents boron penetration.

It is still another object to provide a process with an increased process window by using this ultra-thin silicon nitride ($Si_3N_4$) layer followed by a low-pressure re-oxidation rapid thermal process (RTP) in a nitrogen-rich oxidation ambient (dinitrogen oxide $N_2O$) as the oxidation gas. The non-self-limiting characteristic of the ultra-thin silicon nitride layer results in the controllable diffusion of the dissociated oxygen (O) and nitrous oxide (NO) through the silicon nitride layer to form a silicon oxide layer on and in the substrate surface.

In accordance with the above objects, a method for fabricating improved ultra-thin gate oxides for deep sub-micrometer FETs having channel lengths of less than 0.18 micrometers ($\mu m$) is provided. The method results in a very controllable ultra-thin silicon nitride-oxide gate insulating layer (about 18 to 30 Angstroms thick) that also reduces the gate oxide leakage currents and boron penetration. The method also provides a means of forming a very controllable interface silicon oxide layer at the substrate surface while providing a nitrogen-rich oxidized silicon nitride layer. The method for forming this improved FET nitride-oxide gate insulating layer begins by providing a semiconductor substrate consisting of single-crystal silicon and having device areas that are typically surrounded and electrically isolated by field oxide areas. A thin silicon nitride layer is grown on the substrate surface in the device areas. The silicon nitride layer is formed in a low-pressure rapid thermal process (RTP) by applying a first heating step while subjecting the substrate to a first gas ambient containing nitrogen, such as ammonia ($NH_3$), while insuring that the RTP chamber is free of oxygen. The silicon nitride layer is then subjected to a oxidation second heating step and a second gas ambient containing nitrogen and oxygen. The second gas ambient is preferably dinitrogen oxide ($N_2O$), and the second heating step is at a sufficiently high temperature to form a silicon oxide ($SiO_2$) layer at the interface between the silicon nitride layer and the substrate an the device areas. Concurrently the oxidation is carried out in the nitrogen-rich gas ($N_2O$) to retain a high nitrogen concentration in the oxidized silicon nitride layer This results in an ultra-thin nitrogen-rich silicon nitride-oxide gate insulating layer (about 18 to 30 Angstroms thick) that achieves the above objectives.

BRIEF DESCRIPTION OF THE DRAWINGS

The objects and other advantages of the invention will become more apparent in the preferred embodiment when read in conjunction with the following drawings.

DESCRIPTION OF THE PREFERRED EMBODIMENT

Figure 1:
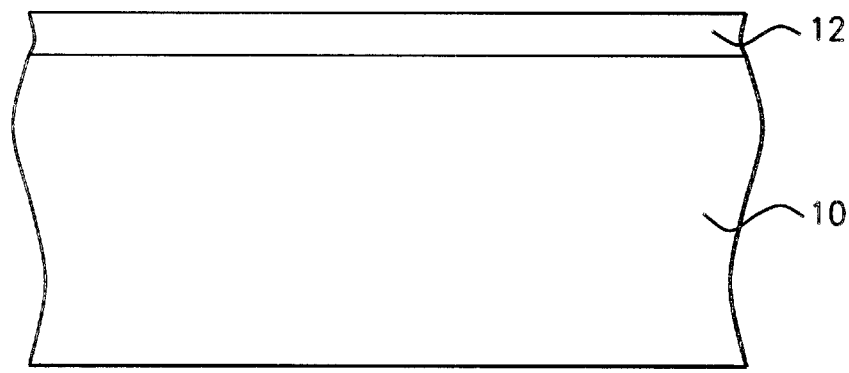
FIG. 1 shows a schematic cross-sectional view of a device area after forming the silicon nitride layer on the silicon substrate and prior to the oxidation process step.
Figure 2:
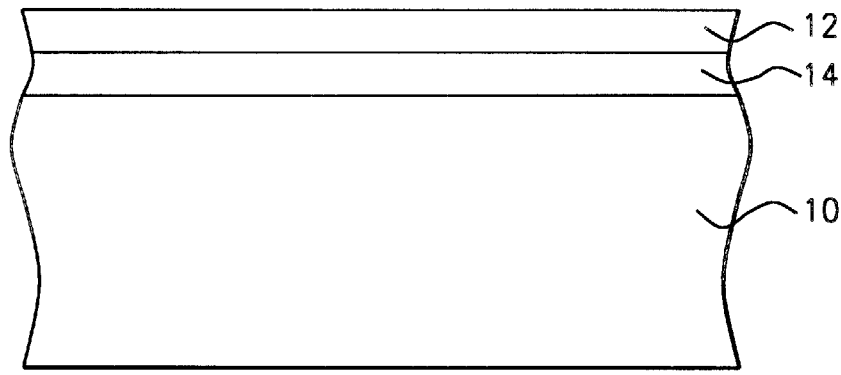
FIG. 2 shows a schematic cross-sectional view of the device area after the oxidation process step depicting the formation of the silicon oxide layer at the silicon nitride-substrate interface.

In accordance with the objects of this invention, a method for making the ultra-thin silicon nitride-oxide gate oxide layer for FETs is now described in detail. Although the method is depicted in FIGS. 1 and 2 for a single device area, the method is usually applied to a multitude of device areas on the semiconductor chip and is applicable to both N-channel and P-channel FETs on the same chip from which complementary metal oxide silicon (CMOS) circuits can be formed. These device areas on the substrate are typically surrounded and electrically isolated by relatively thick field oxide regions. The field oxide is not relevant to the invention and therefore is not explicitly shown in the figures to simplify the drawings and the discussion. However, generally for advanced integrated circuits the field oxide is a Shallow Trench Isolation (STI), as commonly practiced in the industry, and is essentially planar with the substrate surface.

Referring to FIG. 1, a portion of a device area on a substrate 10 is shown. The substrate 10 is typically a single-crystal silicon and is conductively doped with an N-type dopant, such as arsenic, or with a P-type dopant, such as boron (B). For CMOS circuits the substrate would include both P and N doped wells in and on which are formed the N and P channel FETs, respectively. After forming a field oxide, (not shown) the surface of the device areas is subjected to a cleaning step, and any remaining native oxide is removed. For example, the native oxide can be removed by subjecting the substrate to a short silicon oxide etch using a dilute hydrofluoric acid (HF)/H$_2$O solution.

The improved ultra-thin silicon nitride-oxide gate insulating layer is then formed in a two-step process. In the first step a silicon nitride layer 12 is formed on the silicon substrate 10, as shown in FIG. 1. The method is preferably carried out in a rapid thermal process (RTP) system at low or reduced pressure. For example, the growth of the silicon nitride (Si$_3$N$_4$) layer 12 can be performed in a reduced-pressure RTP XE Centura system chamber manufactured by Applied Materials Corporation of California. The RTP XE Centura is usually used for making the more conventional ultra-thin silicon gate oxides by the In-Situ Steam Generation (ISSG) process. The Si$_3$N$_4$ layer 12 is formed by subjecting the substrate 10 in the RTP to an ammonia (NH$_3$) vapor at an elevated temperature of between about 600 and 1000° C. for a time of between about 10 and 60 seconds, and more particularly at a temperature of 800° C. for a time of 20 seconds. The silicon nitride layer 12 is grown at a reduced pressure of 10 to 100 torr, and is grown to a preferred thickness of between about 10 and 30 Angstroms. The reduced pressure allows the layer 12 to be grown at a slower and more controllable rate.

Referring to FIG. 2, an oxidation step is carried out sequentially (and in situ) in the same RTP chamber using a second heating step. The substrate 10 is subjected to an oxidation gas, composed preferably of dinitrogen oxide (N$_2$O). The second heating step is carried out at a preferred temperature of 800 to 1050° C. for a time of between about 10 and 120 seconds, and also at a reduced pressure of about 10 to 140 torr. More particularly, the oxidation is performed at a preferred temperature of about 950° C. for about 30 seconds.

Because of the low pressure and sufficiently higher temperature of the second heating step, and because of the non-self-limiting characteristic of the dissociated products of the N$_2$O gas (i.e., NO and O) through the ultra-thin Si$_3$N$_4$ layer 12, it is possible to grow a good quality ultra-thin silicon oxide (SiO$_2$) layer 14 at the interface between the silicon nitride layer 12 and the substrate 10, as shown in FIG. 2. This results in lower gate oxide leakage currents, as will be demonstrated in the following EXAMPLE. Since the NO and O diffusion rate through the Si$_3$N$_4$ layer 12 is reduced compared to a conventional ISSG SiO$_2$ layer, the formation and thickness of the very thin SiO$_2$ layer 14 at the substrate surface can be more accurately controlled. Also, the thickness of the ultra-thin silicon nitride-oxide gate insulating layer (layers 12 and 14) can be fine tuned to provide an equivalent oxide thickness (EOT) as a pure silicon oxide gate oxide.

Because of the higher nitrogen concentration in the ambient gas (N$_2$O) a higher nitrogen (N) concentration is incorporated into the oxidized silicon nitride layer 12. This nitrogen-enriched layer 12 further reduces the boron penetration that can otherwise occur during subsequent processing, resulting in unstable electrical characteristics of the FET device.

EXAMPLE

Figure 3:
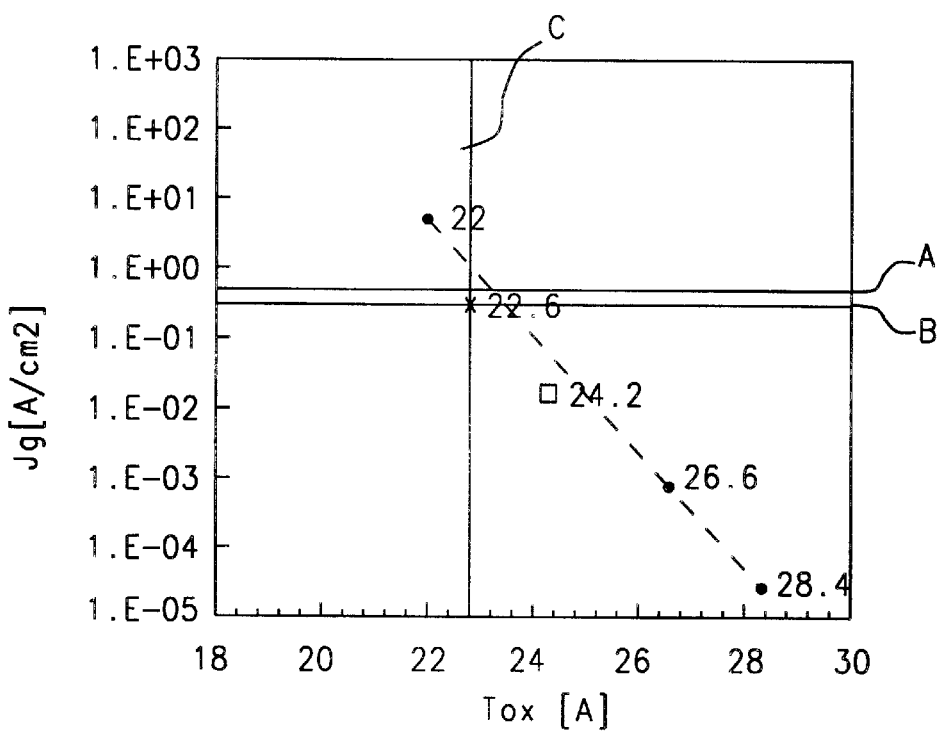
FIG. 3 shows a semilog graph of the gate oxide leakage current density $J_g$ (Amp/cm$_2$) vs. the gate oxide thickness $T_{ox}$ (Angstroms) for a gate oxide on an N doped (phosphorus) silicon substrate, and compares the ultra-thin silicon nitride-oxide gate insulating layer, of this invention, to the conventional in-situ steam generation (ISSG) process using nitrous oxide (NO) as the oxidation gas.
Figure 4:
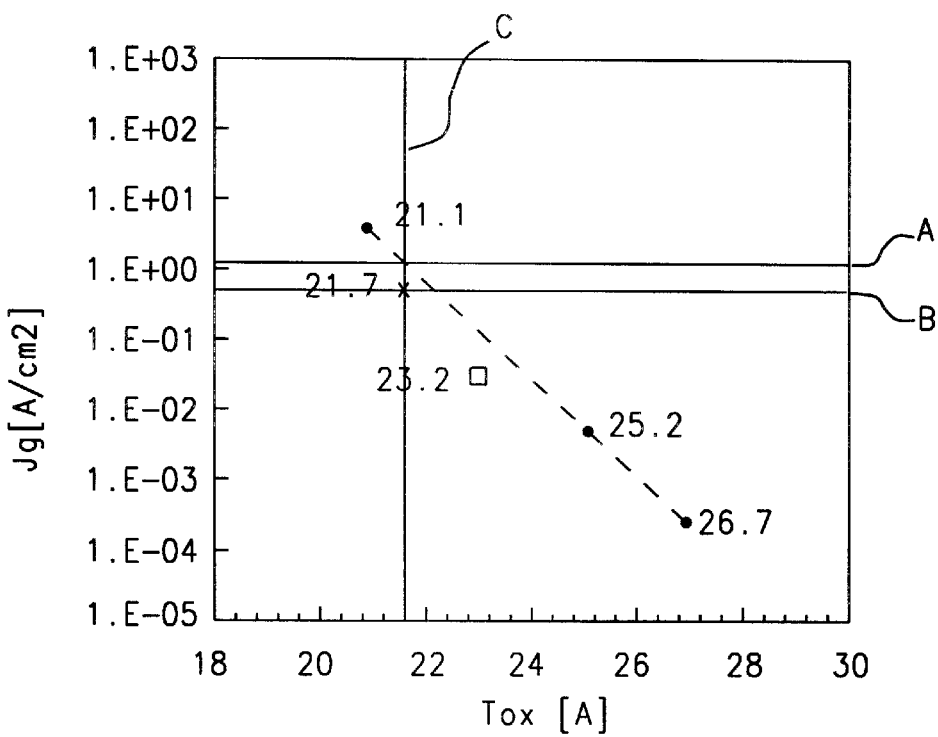
FIG. 4 shows a semilog graph of the gate oxide leakage current density $J_g$ (Amp/Cm$_2$) vs. the gate oxide thickness $T_{ox}$ (Angstroms) for a gate oxide on a P doped (boron) substrate, and compares the ultra-thin silicon nitride-oxide FET gate insulating layer, of this invention, to the conventional ISSG process using nitrous oxide (NO) as the oxidation gas.

To better appreciate the advantages of this novel process for making ultra-thin FET gate insulating layers, test structures were fabricated and the nitride-oxide gate oxide leakage currents were measured as a function of gate oxide thickness. The results were then compared with the more conventional ISSG process using nitrous oxide (NO) as the oxidation gas. The graph in FIG. 3 is for a gate oxide grown on an N-doped substrate (or wafer), and the graph in FIG. 4 is for a gate oxide grown on a P-doped substrate. The vertical axis in each graph is the leakage current density $J_g$ measured on a log scale in Ampere per square cm (A/cm$^2$), and the horizontal axis is the gate oxide thickness $T_{ox}$ measured in Angstroms. After forming the ultra-thin silicon nitride-oxide gate insulating layer (layers 12 and 14), an N-doped polysilicon gate electrode was formed over an oxide area of 1.0 E $^{-4}$ cm$^2$. The current density was measured using a model HP4284 instrument manufactured by Hewlett Packard of U.S.A. The dashed line and solid dots are a plot of the leakage current $J_g$ vs. thickness $T_{ox}$ for an ultra-thin gate oxide formed by a conventional ISSG process using a NO oxidation gas. The number next to each data point represents the exact oxide thickness. The point x in each of the graphs is the leakage current $J_g$ for the ultra-thin nitride-oxide gate insulating layer, of this invention, grown in a LP-RTP tool using NH$_3$ to form the Si$_3$N$_4$ layer 12 at a temperature of 800° C. for 20 seconds and then applying a oxidation step in N$_2$O at a temperature of 900° C. for 30 seconds. The square data point in each graph is the leakage current $J_g$ in the ultra-thin nitride-oxide gate insulating layer, of this invention, using NH$_3$ to form the Si$_3$N$_4$ layer 12 at a temperature of 800° C. for 20 seconds and then applying an oxidation step in N$_2$O at a higher temperature of 950° C. for 30 seconds. The horizontal lines A are the leakage current using the conventional ISSG oxide. The horizontal lines B are the leakage current for this novel nitride-oxide gate insulating layer. The difference between the horizontal line A for the conventional process and the horizontal line B for this invention shows the reduction in leakage current at the same gate oxide thickness, represented by the vertical line C. One of the advantages of this invention of growing a SiO$_2$ layer 14 at the substrate 10 surface after forming a Si$_3$N$_4$ layer 12 is clearly demonstrated by the above results. The non-self-limiting characteristic for the diffusion of NO and O through the ultra-thin Si$_3$N$_4$ layer 12, at elevated temperature, also increases the process latitude (process window) and the nitrogen-enriched oxidized Si$_3$N$_4$ layer 12 also limits or prevents boron penetration during subsequent processing steps.

Figure 5:
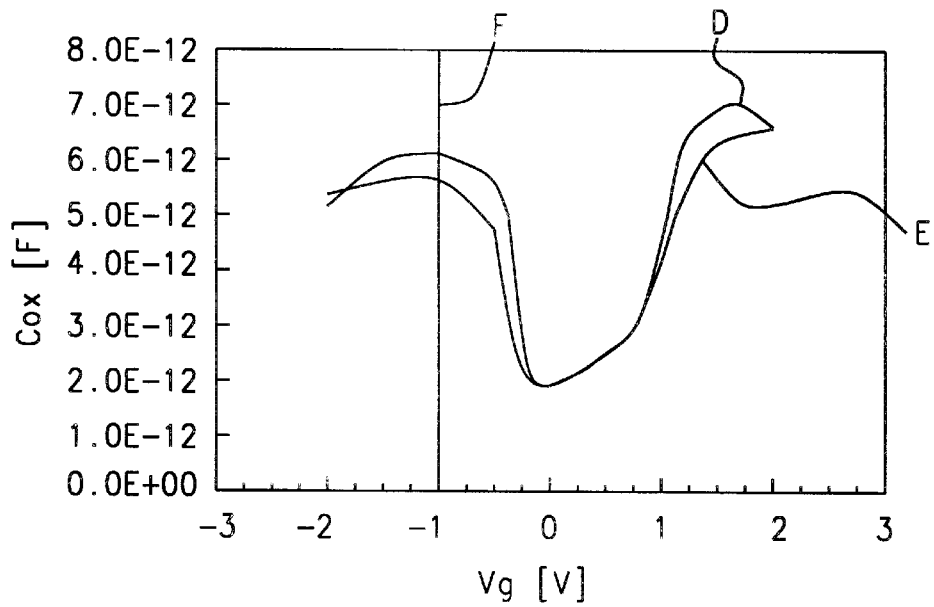
FIG. 5 shows a graph of a capacitor vs. voltage curves for an MOS capacitor on an N doped wafer with a silicon nitride-oxide ultra-thin gate insulating layer and having an electrode area of 400 square micrometers.
Figure 6:
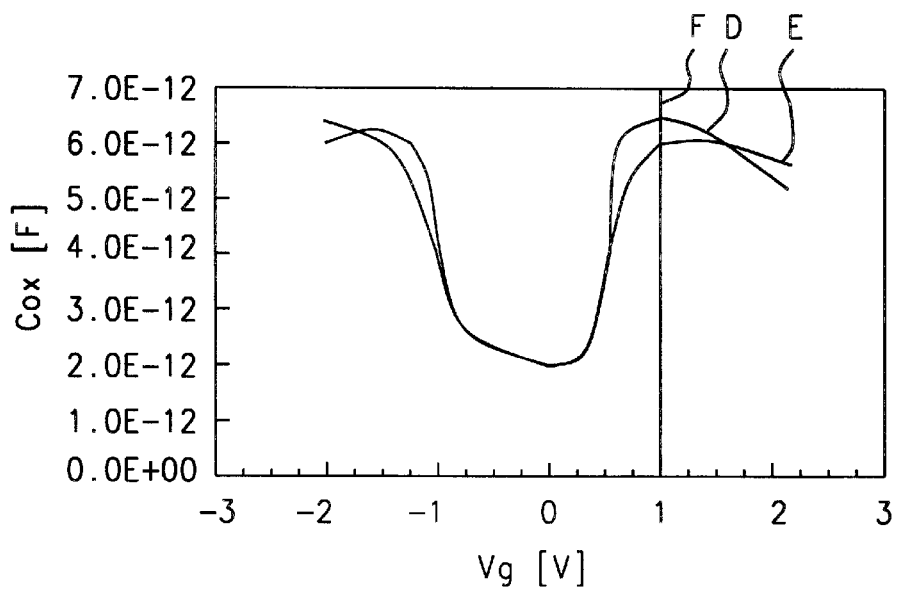
FIG. 6 shows a graph of a capacitor vs. voltage curves for an MOS capacitor on a P doped wafer with a silicon nitride-oxide ultra-thin gate insulating layer and having an electrode area of 400 square micrometers.

MOS capacitor devices were made using this silicon nitride-oxide ultra-thin gate insulating layer. The devices were made using polysilicon electrodes having an area of 400 square micrometers. The capacitor-voltage (C-V) curves were measured using a model HP4284 measuring tool manufactured by Hewlett Packard of U.S.A. FIG. 5 shows the C-V results for an MOS device on an N doped substrate, and FIG. 6 shows the C-V results for an MOS device on a P doped substrate. The curve D in FIGS. 5 and 6 is for the ultra-thin gate insulating layer formed in NH$_3$ at 700° C. for 10 seconds, and oxidized in N$_2$O at 900° C. for 30 seconds, while curve E is for the ultra-thin gate insulating layer formed in NH$_3$ at 700° C. for 10 seconds, and oxidized in N$_2$O at 950° C. for 30 seconds. The vertical line F in FIG. 5 indicates the voltage at −1 volt, and the vertical line F in FIG. 6 indicates the voltage at 1 volt. The curves in FIGS. 5 and 6 show no discontinuities and show an MOS capacitor device that has a gate voltage ($V_g$) that is less than 1 volt and greater than −1 volt. These results indicate a good quality silicon-silicon oxide interface.

While the invention has been particularly shown and described with reference to the preferred embodiment thereof, it will be understood by those skilled in the art that various changes in form and details may be made without departing from the spirit and scope of the invention.

What is claimed is:

1. A method for forming a silicon nitride-oxide FET gate insulating layer on a substrate having reduced leakage currents comprising the steps of:
   providing a semiconductor substrate having device areas,
   growing a silicon nitride layer on said device areas by applying a first heating step to said substrate in a first gas ambient containing nitrogen and is oxygen-free, and at a temperature of between 600 and 900° C.;
   oxidizing said silicon nitride layer using a second heating step and a second gas ambient containing nitrogen and oxygen, and said second heating step is at a sufficiently high temperature to concurrently form, in said device areas, a silicon oxide layer at the interface between said silicon nitride layer and said substrate, thereby completing said FET gate insulating layer having reduced leakage currents.

2. The method of claim 1, wherein said semiconductor substrate is a single crystal silicon substrate.

3. The method of claim 1, wherein said silicon nitride layer is grown by low-pressure rapid thermal processing (LP-RTP).

4. The method of claim 1, wherein said first gas is ammonia (NH$_3$) and said first heating step is for a time of between about 10 and 60 seconds.

5. The method of claim 1, wherein said silicon nitride layer is grown to a thickness of between about 10 and 30 Angstroms.

6. The method of claim 1, wherein said second heating step is carried out in a low-pressure rapid thermal processing (RTP) system.

7. The method of claim 1, wherein, said second gas ambient is dinitrogen oxide (N$_2$O) and said second heating step is at a temperature of between about 800 and 1050° C. for a time of between 10 and 120 seconds.

8. The method of claim 1, wherein said first and second heating steps are carried out sequentially in the same low-pressure rapid thermal processing system.

9. A method for forming a silicon nitride-oxide FET gate insulating layer on a substrate having reduced leakage currents comprising the steps of:
   providing a semiconductor substrate having device areas;
   growing a silicon nitride layer on said device areas by applying a first heating step to said substrate in a first gas ambient composed of ammonia (NH$_3$) and, at a temperature of between 600 and 900° C.;
   oxidizing said silicon nitride layer using a second heating step and a second gas ambient containing nitrogen and oxygen, and said second heating step is at a sufficiently high temperature to concurrently form, in said device areas, a silicon oxide layer at the interface between said silicon nitride layer and said substrate, thereby completing said FET gate insulating layer having reduced leakage currents.

10. The method of claim 9, wherein said semiconductor substrate is a single crystal silicon substrate.

11. The method of claim 9, wherein said silicon nitride layer is grown by low-pressure rapid thermal processing (LP-RTP).

12. The method of claim 9, wherein said first heating step is for a time of between about 10 and 60 seconds.

13. The method of claim 9, wherein said silicon nitride layer is grown to a thickness of between about 10 and 30 Angstroms.

14. The method of claim 9, wherein said second heating step is carried out in a low-pressure rapid thermal processing system.

15. The method of claim 9, wherein said second gas ambient is dinitrogen oxide (N$_2$O) and said second heating step is at a temperature of between about 800 and 1050° C. for a time of between 10 and 120 seconds.

16. A method for forming a silicon nitride-oxide FET gate insulating layer on a substrate having reduced leakage currents comprising the steps of:
   providing a semiconductor substrate having device areas;
   growing a silicon nitride layer on said device areas by applying a first heating step to said substrate in a first gas ambient containing nitrogen and is oxygen-free, and at a temperature of between 600 and 900° C.;

oxidizing said silicon nitride layer using a second heating step and a second gas ambient consisting of dinitrogen oxide, and said second heating step is at a sufficiently high temperature to concurrently form, in said device areas, a silicon oxide layer at the interface between said silicon nitride layer and said substrate, thereby completing said FET gate insulating layer having reduced leakage currents.

17. The method of claim 16, wherein said semiconductor substrate is a single-crystal silicon substrate.

18. The method of claim 16, wherein said silicon nitride layer is grown by low-pressure rapid thermal processing (LP-RTP).

19. The method of claim 16, wherein said first gas is ammonia ($NH_3$) and said first heating step is for a time of between about 10 and 60 seconds.

20. The method of claim 16, wherein said silicon nitride layer is grown to a thickness of between about 10 and 30 Angstroms.

21. The method of claim 16, wherein said second heating step is carried out in a low-pressure rapid thermal processing system.

22. The method of claim 16, wherein said second heating step is at a temperature of between about 800 and 1050° C. for a time of between 10 and 120 seconds.

* * * * *